United States Patent [19]

Korman et al.

[11] Patent Number: 5,043,859
[45] Date of Patent: Aug. 27, 1991

[54] HALF BRIDGE DEVICE PACKAGE, PACKAGED DEVICES AND CIRCUITS

[75] Inventors: Charles S. Korman, Schenectady; Alexander J. Yerman, Scotia; Sayed-Amr A. El-Hamamsy; Constantine A. Neugebauer, both of Schenectady, all of N.Y.

[73] Assignee: General Electric Company, Schenectady, N.Y.

[21] Appl. No.: 454,550

[22] Filed: Dec. 21, 1989

[51] Int. Cl.$^5$ ................ H02M 7/521; H01L 25/00
[52] U.S. Cl. .................... 363/147; 363/132; 361/397; 361/409; 174/260; 174/524; 357/41
[58] Field of Search ............. 363/132, 147; 361/395, 361/397, 400, 401, 402, 403, 406, 409, 412, 417, 418, 420, 421; 174/260, 261, 52.1, 52.2, 52.4; 357/41

[56] References Cited

U.S. PATENT DOCUMENTS

| 4,849,804 | 7/1989 | Mader ..................... 361/397 X |
| 4,862,344 | 8/1989 | Emoto ..................... 363/147 |
| 4,918,590 | 4/1990 | Ohtuka et al. ............. 363/147 X |

Primary Examiner—Steven L. Stephan
Assistant Examiner—Emanuel Todd Voeltz
Attorney, Agent, or Firm—Marvin Snyder; James C. Davis, Jr.

[57] ABSTRACT

A package for a two-switching-device half bridge circuit comprises an insulating substrate having first, second and third external power terminals along with control terminals bonded to the substrate. The power terminals are configured to provide a straight-through-the package current path from the first external power terminal to the second or common external power terminal and from the second or common external power terminal to the third external power terminal. The control terminals are preferably Kelvin terminal pairs in order to minimize feedback from the power current paths to the control circuits. The power devices are preferably bonded to the first external power terminal and the second external power terminal, respectively, with their connections respectively to the second power terminal and third power terminal substantially identical in order to provide power current paths through the package having substantially identical electrical and thermal impedances. This half bridge package is appropriate for use in high performance, high frequency, half bridge circuits.

23 Claims, 10 Drawing Sheets

HALF BRIDGE DEVICE PACKAGE, PACKAGED DEVICES AND CIRCUITS

RELATED APPLICATIONS

This application is related to application Ser. No. 07/654,614, entitled "Driver For a High Efficiency, High Frequency Class-D Power Amplifier" by Sayed-Amr El-Hamamsy et al.; patent application Ser. No. 07/454/549 entitled "Lamp Ballast Configuration" by Sayed-Amr El-Ham al and application Ser. No. 07/454/547 (now U.S. Pat. No. 4,996,116 issued Feb. 26, 1991), entitled "Enhanced Direct Bond Copper Process Structure by H. F. Webster, et al., all filed concurrently herewith. Each of these patent applications is incorporated herein by reference, in its entirety.

BACKGROUND OF THE INVENTION

The present invention relates to packages for semiconductor devices, and more particularly, to packages for high power, high frequency devices.

BACKGROUND INFORMATION

Over the years semiconductor devices have been packaged in a wide variety of packages. A common package for power devices is the TO-220 package which has a metal base and three tab leads which extend from one side of the substantially rectangular package. The semiconductor device and portions of the external leads are encapsulated in plastic which is secured to the base with the aid of coinings (grooves or ledges) along sides of the base. The bottom of package base is left exposed to facilitate thermal connection to a heat sink. A first power terminal of the device is normally exposed at the so-called back surface of the semiconductor chip. During assembly, this terminal of the chip is soldered to the package base. The first power lead or tab of the package is bonded to the package base, the second power lead or tab of the package is wire bonded to the second power terminal of the device and the control lead or tab of the package is wire bonded to the control terminal of the device. After completion of these bonding steps, the semiconductor device, its wire bonds and a portion of the external leads and a portion of the upper surface of the package base are encapsulated in plastic. All of this is normally done with the package leads held in place by a lead frame of additional lead material. Following the encapsulation step, the leads of the package are severed from the lead frame to leave three electrically separate tab leads. In the event that the first power terminal of the device is not exposed at the back surface of the semiconductor device, that first device power terminal may be connected to the corresponding package tab lead by a wire bond connected to the front surface of the device with the corresponding package tab electrically insulated from the package base. In that situation, all three leads of the device are isolated from the package base. However, in most common chips, one power lead is exposed at the back surface of the chip with the result that the package base and one package tab lead are connected in common to that power terminal of the chip.

The circuit of application Serial No. 07/454,615 is designed to be a high efficiency (>85%), high power (300 watts), high frequency (13.56 MHz) driver circuit for use with electrodeless, long life, high intensity discharge lamps. Typical prior art driver circuits have efficiency percentages in the mid-70's. Thus, these are very stringent design goals. Proper operation of this driver circuit is critically dependent on the waveforms and relative timing of signals within the circuit. When this driver circuit was fabricated and tested using power MOSFETs packaged in TO-220 packages, the package bases had to be isolated from each other to prevent undesired short circuits since the two switching devices were connected in series between a positive dc potential and ground. Further, the drain terminal of the FET which is soldered to the package base of the device whose source is connected to ground, has to be isolated from ground. Consequently, the package bases were isolated from each other and ground by inserting a dielectric between the packages and a heat sink. This increased the thermal impedance in the circuit and can result in unequal temperatures for the two devices. This can be detrimental to the operation of the circuit whose proper operation is critically dependent on symmetrical signals and conditions. When fabricated in this manner, the circuits' inductance was too high for proper operation at the desired operating frequency of 13.56 MHz.

There is a need for an improved device package for use in circuits of the type discussed in patent application Ser. No. 07/454/614 in order to facilitate their operation at high frequency.

OBJECTS OF THE INVENTION

Accordingly, a primary object of the present invention is to provide an improved device package which provides low, equal inductances in the power current paths of the switching devices of a half bridge circuit Another object of the present invention is to provide a package which minimizes undesirable feedback coupling between the control and power circuits of a half bridge circuit.

Another object of the present invention is to provide a package which enables symmetric connection of control circuits and power paths in a two-switching-device circuit.

SUMMARY OF THE INVENTION

The above and other objects which will become apparent from the specification as a whole, including the drawings, are accomplished in accordance with the present invention by a device package comprising a single insulating substrate having first, second and third external power terminals bonded thereto with the first and third external power terminals being disposed in opposed relation to the second external power terminal. First and second external control terminals are bonded to the substrate in opposed relation. This package is configured to have the back surface terminals of first and second individual semiconductor power device chips bonded to the first and second external power terminals, respectively, and to have the second power terminals of the chips connected, respectively, to the second external power terminal and the third external power terminal. The first and second control terminals are preferably each a Kelvin pair with one terminal of each pair configured for connection to the control terminal of the semiconductor chip and the other terminal of the pair configured for connection to the power terminal of that chip to which the control signal is referenced.

In accordance with the invention, a packaged half bridge circuit includes this package with two power devices bonded and connected to it and encapsulated in plastic or otherwise enclosed as may be preferred.

Also in accordance with the invention, the packaged half bridge circuit may be used for converting a dc voltage to an ac signal by connecting the dc voltage across the first and third external power terminals and the ac load circuit between the second external power terminal and a reference potential with the control circuits of the two devices connected to control circuitry for the bridge circuit. The packaged half bridge circuit may also be used with a center-tapped transformer to rectify an ac signal to provide a dc voltage by connecting the ac signal (the outer terminals of the transformer) across the first and third external power terminals and connecting the dc load between the second external power terminal and the center tap reference and driving the control circuits of the two switching devices from appropriate control circuitry.

Two of these half bridge circuit packages may be interconnected to provide a symmetric full bridge. In this full bridge configuration, either dc to ac signal conversion or ac signal to dc conversion may be provided.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in with the accompanying drawings in which:

DETAILED DESCRIPTION

Figure 1:
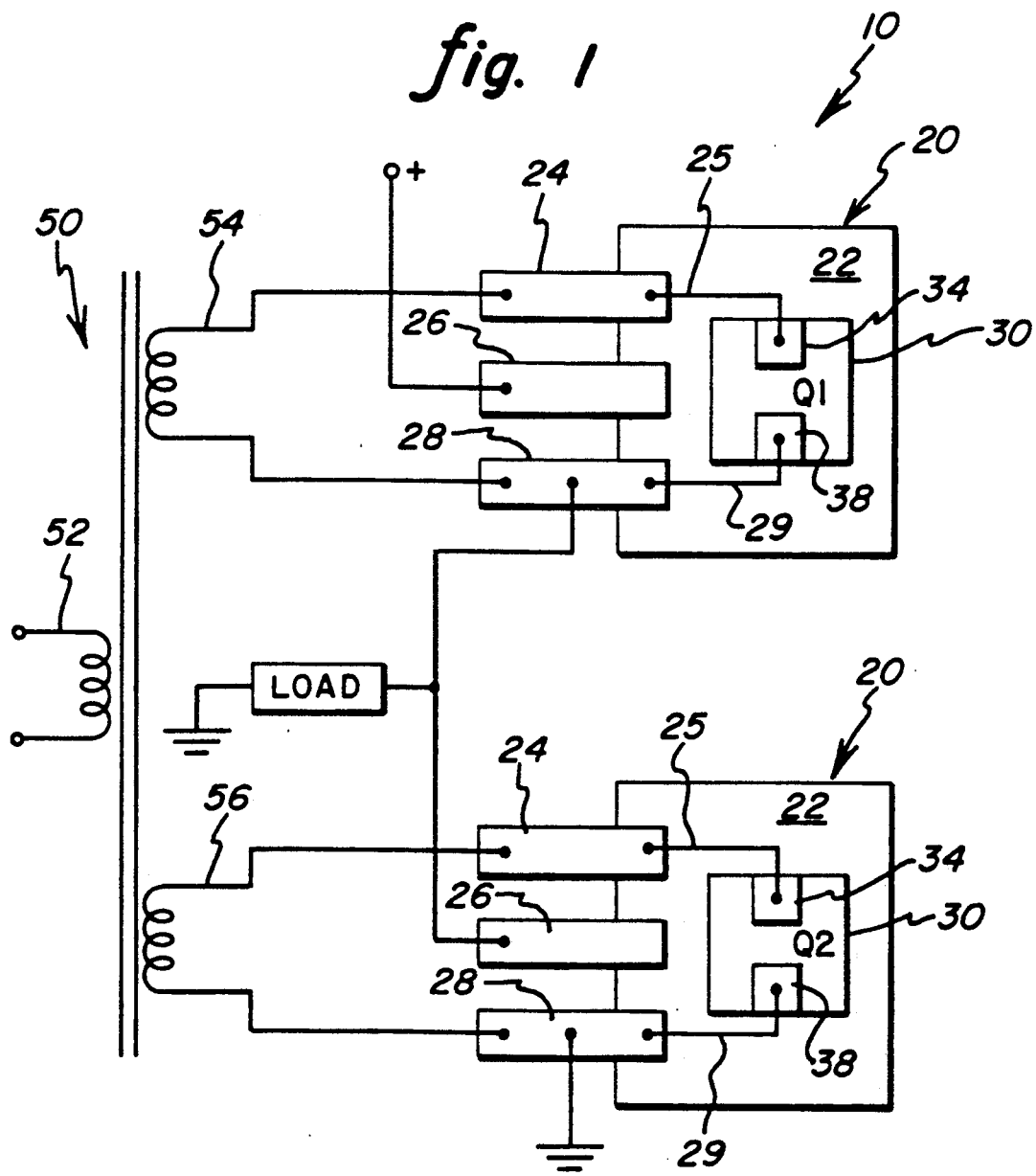
FIG. 1 is a schematic illustration of a class D driver circuit including semiconductor power devices packaged in TO-220 packages connected in the conventional manner within those packages.

In FIG. 1, a portion of a driver circuit 10 in accordance with the teachings of application Ser. No. 07/454/614 is illustrated fabricated with a pair of power MOSFETs 30 serving as the switching devices. Each of these power MOSFETs has a gate contact 34 and a source contact 38 on the upper surface of the chip where it is visible in FIG. 1 and a drain contact 36 on the back of the chip where it is not visible in FIG. 1. In FIG. 1, each of these chips is packaged in the conventional manner in a prior art TO-220 package identified by the reference numeral 20. The packages 20 are shown without plastic encapsulation for drawing clarity. Each package 20 comprises a metallic base 22, an external gate lead 24, an external drain lead 26 and an external source lead 28. The gate lead 24 and the source lead 28 are electrically isolated from the package base 22. The drain lead 26 is normally connected directly to the package base 22. The MOSFET 30 has its drain contact 36 (not visible in the figure) soldered to the package base 22, its gate contact 34 connected to the gate terminal 24 of the package by a wire bond 25 and its source terminal 38 connected to the source terminal 28 of the package by a wire bond 29. As can be seen in the figure, the gate terminal 24, the drain terminal 26 and the source terminal 28 all extend from a single (left) side of the package 20.

As connected in the driver circuit of application Ser. No. 07/454/614, the positive terminal of a dc voltage supply is connected to the drain lead 26 of the upper device ($Q_1$) in the figure and the negative or ground terminal of the dc voltage source is connected to the source lead 28 of the bottom device ($Q_2$) in the figure. The source terminal 28 of the upper device $Q_1$ in the figure is connected to the drain terminal 26 of the lower device $Q_2$ in FIG. 1 and the load circuit is connected between that connection and ground. The gate or control terminals of the devices are driven by secondary windings 54 and 56 of a transformer 50 having a primary winding 52.

The driver circuit of application Ser. No. 07/454,614 was fabricated in this manner using IRF 540 MOSFETs (available from International Rectifier) rated at 100 volts and 27 amperes. The TO-220 packages were mounted on a common heat sink with metallized alumina slabs about 25 mils (630 microns) thick disposed between the package bases and the heat sink. The packages were soldered to the metallization on the alumina to minimize thermal resistance. When it was attempted to operate this circuit at 13.56 MHz, it had an overall efficiency of 40% and a maximum output (load) power level of 35 watts. The efficiencies were calculated as the percentage of the dc input power which was dissipated in the load. Thus, fabricated in this way, the circuit did not even approach its design goals of 85% efficiency and 300W output. We determined that this low efficiency and low power output was a result of ringing in the circuitry. This ringing voltage exceeded the safe operating voltage for the devices with a dc power supply voltage of only 10 volts dc.

We found that this ringing had a number of causes. First, in order to handle the required voltage and current, the MOSFET chips were relatively large (170 mils x 200 mils or 4.32 mm x 5.08 mm) and thus had a high output capacitance of about 1800 pf when the device was off. This high capacitance, in combination with the inductances present in the circuit, had a resonant frequency (~30 MHz) which was close enough to the desired drive frequency of 13.56 MHz to be a substantial circuit design problem. We determined that one cause of the relatively high inductance of this circuit is the current path followed by the in the TO-220 package. In particular, the current enters the package drain terminal 26, flowing left to right in FIG. 1, flows into the package base 22, through the MOSFET 30 and out through the package source terminal 28 flowing right to left in FIG. 1. In so doing, the current flows in a single turn inductor. This increases the inductance already present as a result of the wire bond 29. In an attempt to reduce this circuit inductance, we modified the TO-220 packages by clipping off the drain terminals 26 and using the package base as the drain terminal as illustrated in FIG. 2.

We also determined that another cause of this ringing was feedback between the power and control circuits as a result of the resistance and inductance between the source terminal 38 of the chip 30 and the external source terminal 28 of the package to which the gate drive signal was referenced.

Figure 2:
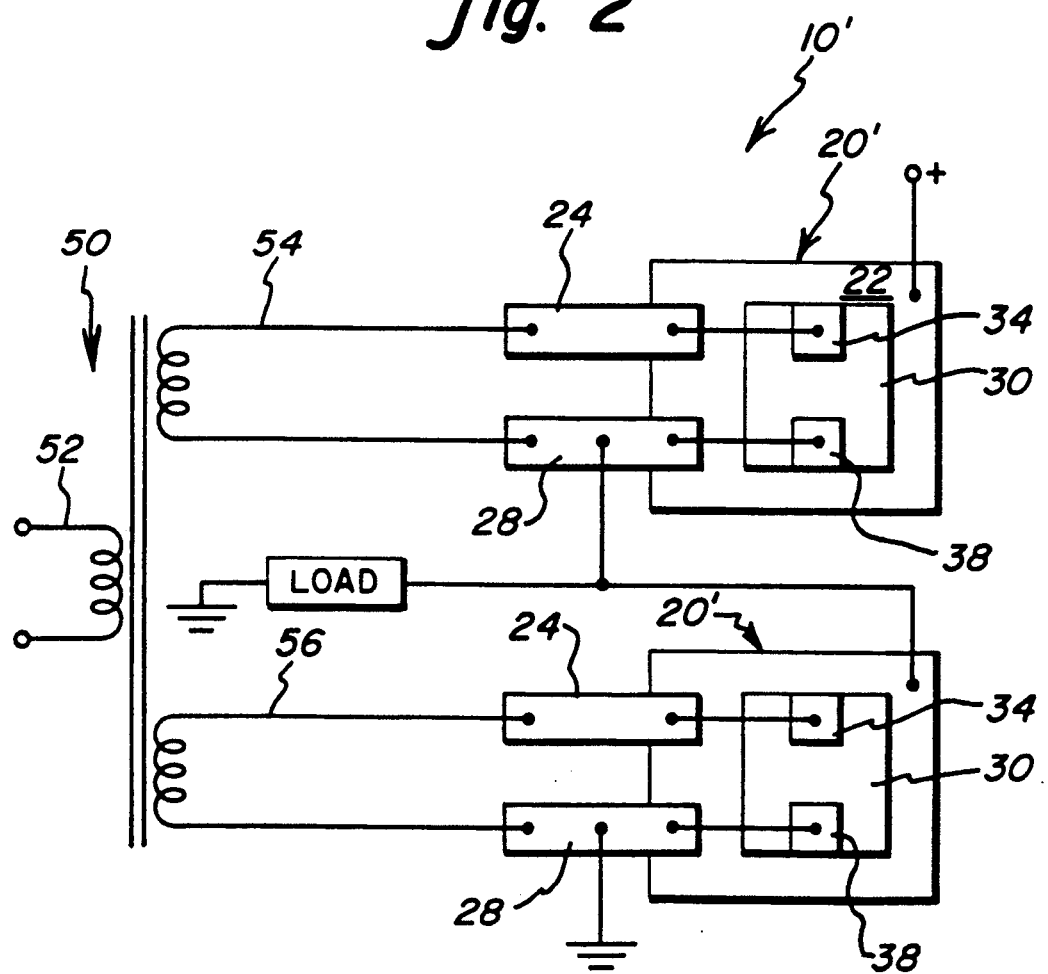
FIG. 2 is a schematic illustration of the circuit of FIG. 1 in which the TO-220 packages have been modified to reduce induct within the circuit.

With the circuit in the configuration shown in FIG. 2, the inductance of the current path from the load through the lower device Q2 to the ground terminal incorporates a single inductive turn, while the current path from the positive dc terminal through the upper device Q1 to the load includes only a straight path and not a full turn. Consequently, the inductance was unbalanced between the upper and lower power current paths. This unbalance was excessive for the driver circuit of application Serial No. 07/454,614. However, the inductance through the lower device Q2 had been reduced to about 10 nanohenrys which was a substantial improvement over the approximately 15 nanohenrys present in the FIG. 1 embodiment. This reduction in the inductance shifted the resonance to ~37 MHz which is still close enough to the operating frequency of 13.56 MHz that the resonance still prevented proper operation of the circuit. Further, the control circuitry still suffered from feedback resulting from the inductance and resistance between the end of the package source terminal 28 and the device source terminal 38. The heat sinking problem was also unchanged.

Figure 3:
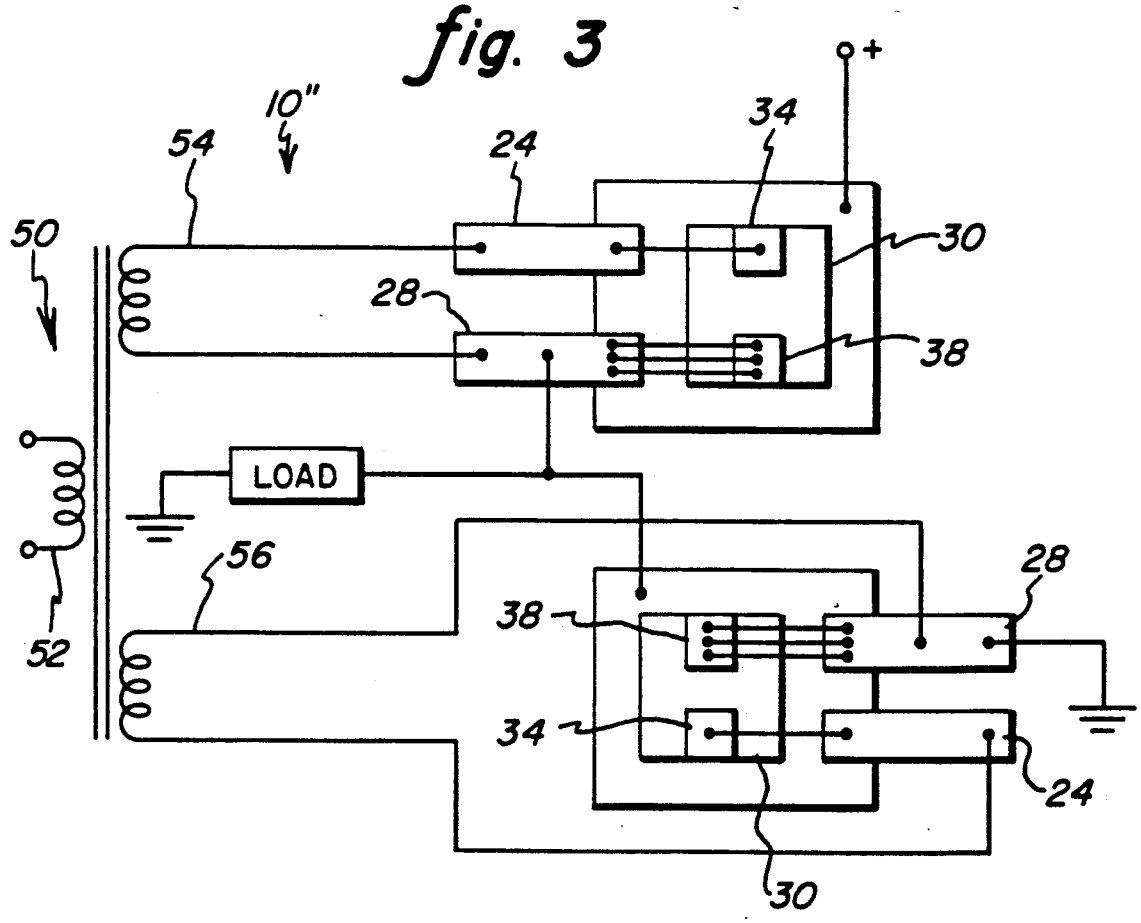
FIG. 3 is a modified arrangement of the FIG. 2 circuit designed to equalize the inductances of the power current paths for the two power devices.

The inductances in the power current paths, could have been equalized by reconfiguring the circuit 10' in the manner illustrated in FIG. 3 for the circuit 10. In this configuration, the lower TO-220 package is rotated 180 so that the power current path through each TO-220 package is a straight line. This would equalize the inductances in the two paths at about 10 nanohenrys, but that would still be excessive. It would also make the gate driver circuits non-symmetric, thereby causing difficulties in matching the control circuits. Further, in this configuration, the circuit would still have suffered from the heat sinking and feedback problems which were experienced in the circuit 10 of FIG. 1 and the circuit 10' of FIG. 2. This circuit would only have decreased the inductance by about 30% from the initial value of 15 nh in each path. Calculations showed that a reduction to between 1 nh and 5 nh—a reduction of between 93% and 66% —would be needed for proper operation. Consequently, this circuit configuration was not built.

The circuit of FIG. 1 was built with IRF 510 MOSFETs which are packaged in TO-220 packages. These IRF 510 devices are much smaller than the IRF 540 devices and have current and voltage ratings of 4 amps and 100 volts. When this circuit was operated at the limit of the device specifications, it delivered 75 watts to the load (because the parasitic resonance was at a much higher frequency where it did not interfere with circuit operation). However, 75 watts was only ¼ of our power requirement.

Figure 6:
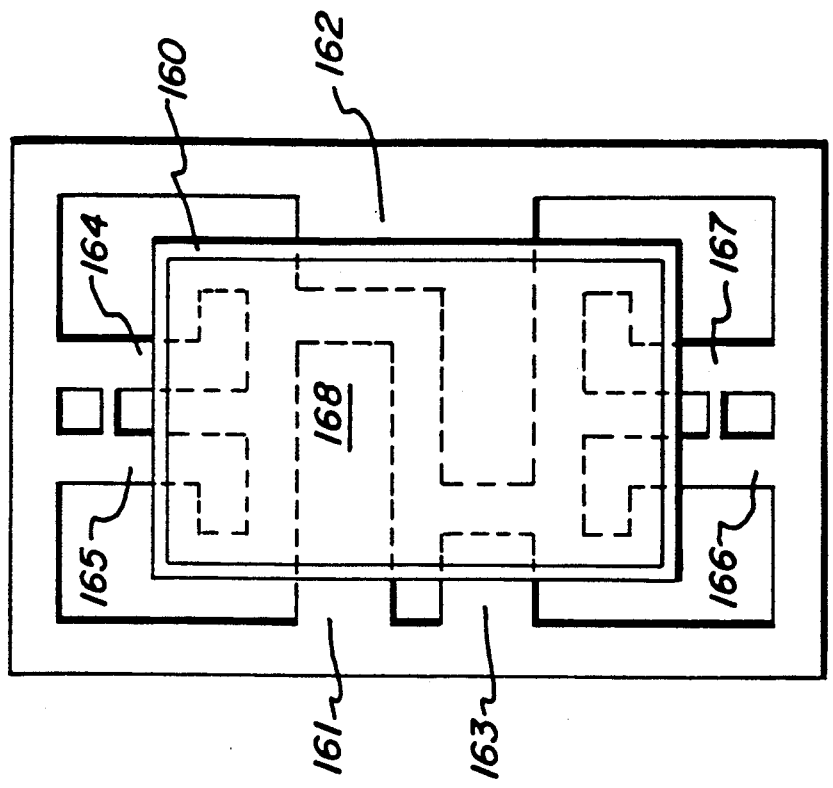
FIG. 6 is a bottom plan view of the package of FIG. 5.

Since we were unable to fabricate the drive circuit of application Ser. No. 07/454,614 in a satisfactory manner using either TO-220 or modified TO-220 packages, we set out to design a package which would overcome all of the problems experienced in the circuits 10 and 10'. The resulting package 159 is illustrated schematically in circuit 100 in FIG. 4. In the circuit 100, the package 159 comprises a single insulating ceramic substrate 160 having first, second and third external power terminals 161, 162 and 163, respectively, direct bonded to its upper surface. Substrate 160 also has a first Kelvin pair of control terminals 164 and 165 direct bonded to its upper surface above the power terminals 161 and 162 in the illustration and a second set of Kelvin control terminals 166 and 167 direct bonded to its upper surface below the power terminals 162 and 163 in FIG. 4. The package 159 also has a large conductive pad 168 (visible in FIG. 6) direct bonded to the back surface of the substrate 160.

Substrate 160 has first through fourth edges with the first and third external power terminals disposed adjacent the first edge, the second external power terminal disposed adjacent the second edge and the first and second sets of control terminals disposed, respectively, adjacent the third and fourth edges. In package 159, the first and second power MOSFETs 30, Q1 and Q2, have their gate terminals soldered or otherwise bonded, respectively, to the first power terminal 161 and the second power terminal 162. The lower power MOSFET Q2 is rotated 180° relative to the upper power MOSFET Q1 to facilitate the desired connections. The source terminal 38 of the upper power MOSFET Q1 is connected to the power terminal 162 by a plurality of wire bonds 172 in order to maximize power handling capacity and minimize inductance. In order to further reduce inductance we tried a single, wide, flat lead as the connection between the source terminal 8 and the power lead 162. This did not provide any significant improvement. The source terminal 38 of the lower power MOSFET Q2 is connected in a similar manner to the external power terminal 163 by a plurality of wire bonds 173. The gate terminal 34 of the MOSFET Q1 is connected to the control terminal 165 by a single wire bond 175, while the Kelvin source terminal 164 is connected to the source terminal 36 of the upper MOSFET Q1 by a single wire bond 174. Only single wire bonds are used in connecting the control circuit because only minimum current flows in the gate circuit of a power MOSFET and consequently, high currents are not involved The gate terminal of the lower power MOSFET Q2 is connected by a wire bond 177 to the control terminal 167 while the source terminal of the lower power MOSFET Q2 is connected by a wire bond 176 to the Kelvin source terminal 166 of the package.

It will be observed that the current path from the positive dc terminal to the load is a straight path through the package and upper power MOSFET Q1. In a similar manner, the current path between the load and the ground terminal of the dc voltage supply is a straight path through the package and the lower power MOSFET Q2 in the figure. In this manner, the inductances of the two power current paths are made substantially equal and reduced to 3 nanohenrys for each path. This is a 5 to 1 reduction in inductance compared to circuit 10' of FIG. 2. It will further be observed that the control circuits connecting the secondary windings 54 and 56 of the transformer 50 to the gate circuits of the upper and lower power MOSFETs are mirror images about a horizontal center line through the package 159 and thus are substantially equal in inductance and path length, and thus delay. Further, the use of Kelvin control contacts eliminates, from the control circuit, the inductance and resistance in the power terminal wire bonds and external power leads thereby substantially eliminating feedback between the power and control circuits of the device package.

Figure 4:
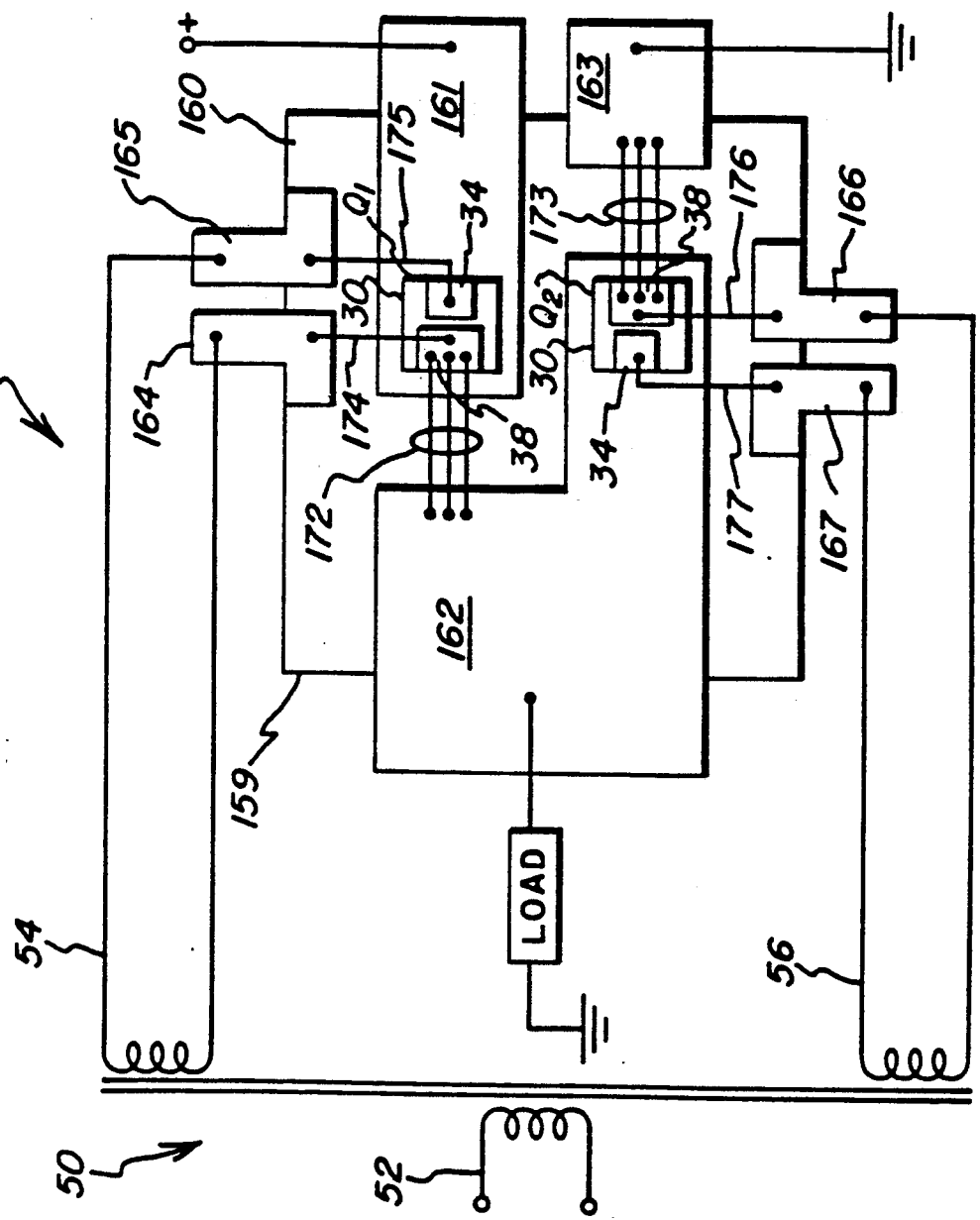
FIG. 4 is a schematic illustration of a package in accordance with the present invention incorporated in the driver circuit of FIGS. 1-3.

When fabricated in the manner indicated in FIG. 4 using the package 159 in accordance with the present invention, the driver circuit of application Ser. No. 07/454,614 was substantially free of ringing (its ringing frequency was measured as being in the neighborhood of 70 MHz). Further, with a dc supply voltage of 75 volts and with the back terminal 168 of the package 159 in direct contact with a heat sink, but with the devices not encapsulated in plastic, the drive circuit operated with an efficiency of 88% with a power output of 300W. This increased to 91% with a power output of 300W when assembled in the manner disclosed and claimed in Application Ser. No. 07,454,459. As can be seen, this is a substantial improvement over the efficiencies and maximum power outputs measured with the configurations of FIGS. 1 and 2, and expected from the configuration shown in FIG. 3. Further, these results substantially exceeded the stringent design goals of greater than 85% efficiency at a power level (to the load) of 300W.

Consequently, the package 159 illustrated in FIG. 4 is a major improvement in the packaging of half bridge circuits for high power, high frequency use.

Figure 5:
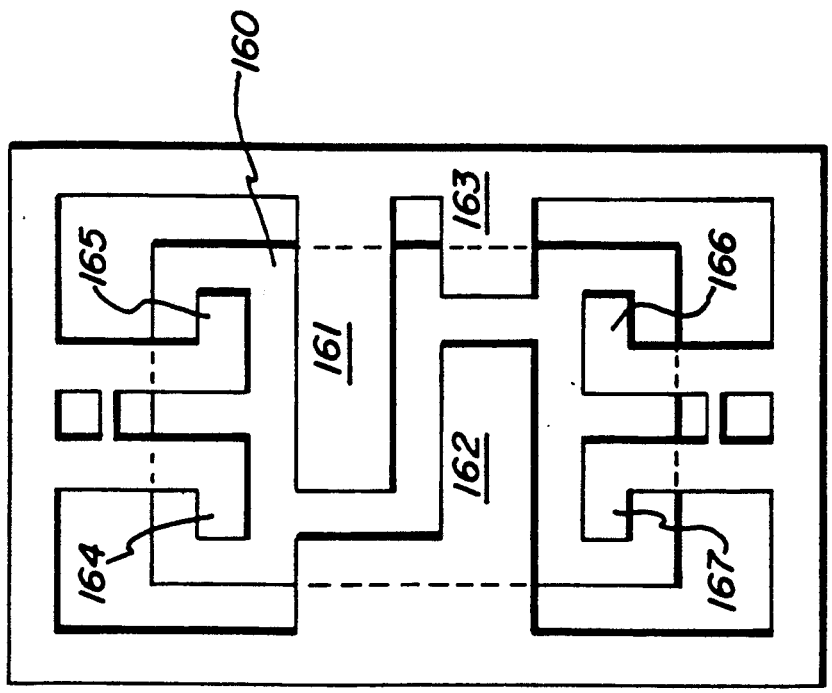
FIG. 5 is a top plan view of a package in accordance with the present invention after bonding of a lead frame to a ceramic substrate and prior to severing the leads from the lead frame.

The package 159 of FIG. 4 is illustrated in plan view in FIG. 5 at the stage of direct bonding the terminals 162-167 to the upper surface of the substrate 160. It will be noted that a single lead frame holds all of the external terminals 161-167 in their desired relation during the direct bonding of these copper terminals to the substrate 160. Package 159 is shown in back plan view in FIG. 6 where the back terminal 168 which is isolated from the terminals on the front of the package may be seen along with the portions of the external terminals 161-167 which extend beyond the substrate 160. The direct bonding of copper external terminals 161-168 to the substrate 160 may be done in accordance with the direct bond copper process taught in U.S. Pat. Nos. 3,744,120, 3,854,892 and 3,911,553 to Burgess et al.; U.S. Pat. Nos. 3,766,634 and 3,993,411 to Babcock et al.; U.S. Pat. Nos. 3,994,430 and 4,129,243 to Cusano et al.; U.S. Pat. Nos. 4,409,278 to Jochym; and U.S. Pat. Nos. 4,563,383 to Kuneman et al. This bond is formed by a liquid copper-copper oxide eutectic mixture (at >1,065° C.) which wets both metallic copper and ceramic materials such as alumina and beryllia and which bonds the members together upon solidification. This process has been in use for many years. Each of these patents is incorporated herein by reference. However, it is preferred to perform this direct bonding in accordance with the related U.S. Pat. No. 4,996,116 cited above in which a platinum or palladium containing layer or film is first deposited on the substrate 160 in substantial alignment with the desired locations of each of the external terminals 161-168 and the direct bond process is then carried out. This results in a more secure mechanical bond between the external terminals and the substrate. That direct bond has an improved wetting angle and is believed to provide improved thermal conductivity as compared to the prior art direct bond copper process.

It is further considered preferable to assemble the package of this application in the driver circuit of application Ser. No. 07/484,614 in the overall configuration illustrated, described and claimed in related application Ser. No. 07/454,549 cited above, because it results in further increases in circuit efficiency and improved dissipation of thermal energy as compared to the planar assembly illustrated in FIG. 4.

It is presently preferred, in order to minimize packaging cost, to encapsulate the power MOSFETs, their wire bonds and a portion of the external terminals 161-167 in plastic as part of the process of producing a packaged half bridge circuit in accordance with the present invention. However, this package configuration may also be provided in a hermetically sealed version by providing a dielectric frame around the periphery of the package, over the external terminals which is hermetically sealed to the substrate 160 and the external terminals 161-167. That dielectric frame may have a suitable upper surface such as a direct bonded copper frame suitable for soldering a metallic or appropriately configured and prepared ceramic lid on top of the package after mounting and bonding of the MOSFET chips.

Figure 7:
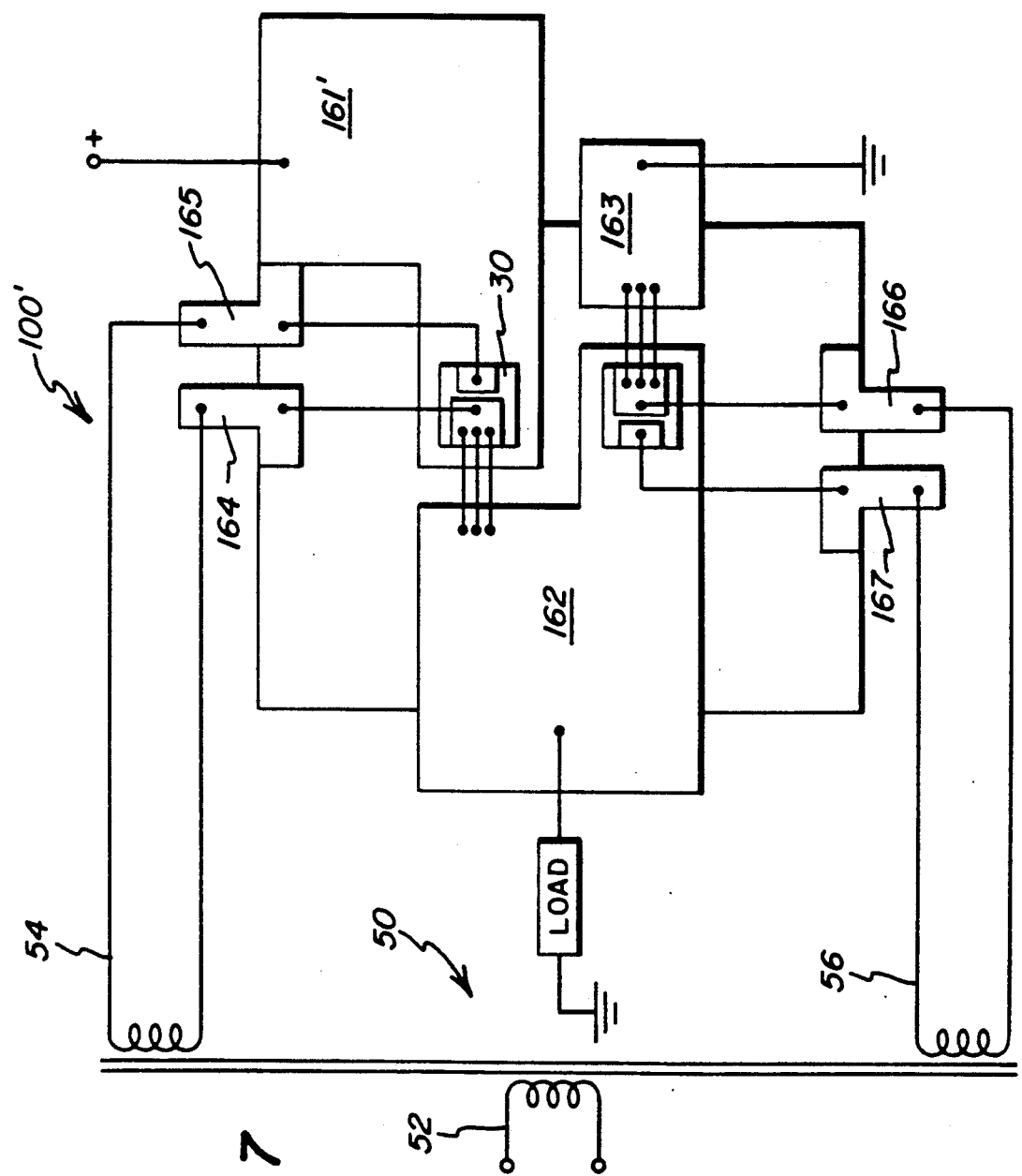
FIG. 7 is a schematic illustration of an alternative version of the package of FIGS. 4-6 disposed in the circuit of FIG. 4.

A modified version of the package of FIG. 4 is illustrated schematically in a modified circuit 100' in FIG. 7. The package 159' in circuit 100' is like the package 159 in circuit 100, except for the configuration of the first external power terminal 161' which is configured as a left/right mirror image of the second external power terminal 162 in order to equalize heat spreading and capacitance to ground through the substrate and heat sink for the upper and lower switching devices 30. If desired, the third external power terminal 163 may be similarly configured, thereby providing complete symmetry in the connections to the two switching devices.

Packages in accordance with this invention may also be used to package devices other than MOSFETs, such as IGBTs, bipolar power transistors and so forth and in other applications than half bridge driver circuits as may be desired. While the package has been illustrated and described as having one upper MOSFET and one lower MOSFET mounted therein, it will be understood that by making the portion of the external power terminal which is bonded to the substrate proportionately wider top-to-bottom in the figure, two or more devices may be mounted in parallel in place of each of the individual devices illustrated in the figures. This increases the current carrying capacity of the packaged half bridge circuit.

These packaged devices may also be used for rectification of ac signals in a half-bridge manner. This may be done using a center-tapped transformer connected across the first and third power terminals 161 and 163 with a load or output filter connected between the second power terminal 162 and the center tap of the transformer.

Figure 8:
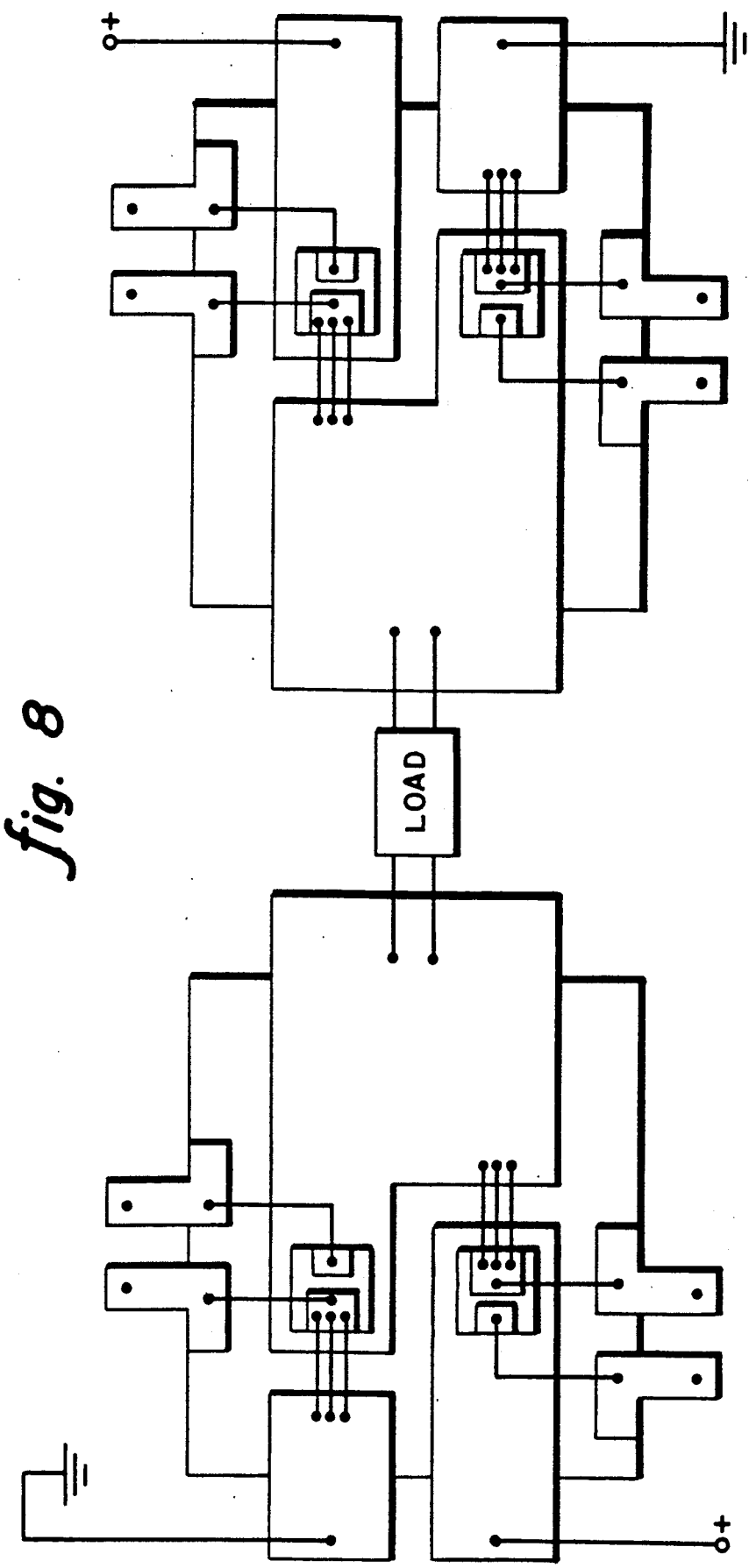
FIG. 8 is a schematic illustration of two packages in accordance with the present invention connected to form a full bridge circuit.

Further increases in the power handling capacity of a circuit can be obtained by using two half bridge circuits to substantially increase the load voltage and thus power as shown in FIG. 8 where, for converting dc to ac, the upper devices in the both packages (one $Q_1$ and one $Q_2$) are ON while the lower devices in both packages (one $Q_2$ and one $Q_1$) are OFF and vice versa. Full bridge ac to dc rectifier circuits may also be fabricated using two of the packages 159 to house the switching devices.

While the package illustrated in FIGS. 4–7 is a substantial improvement over prior art packages, and particularly separately packaged devices, the wire bonds which connect the sources of the devices to external terminals of the package contribute a more than desirable inductance to the overall packaged device pair.

Figure 9:
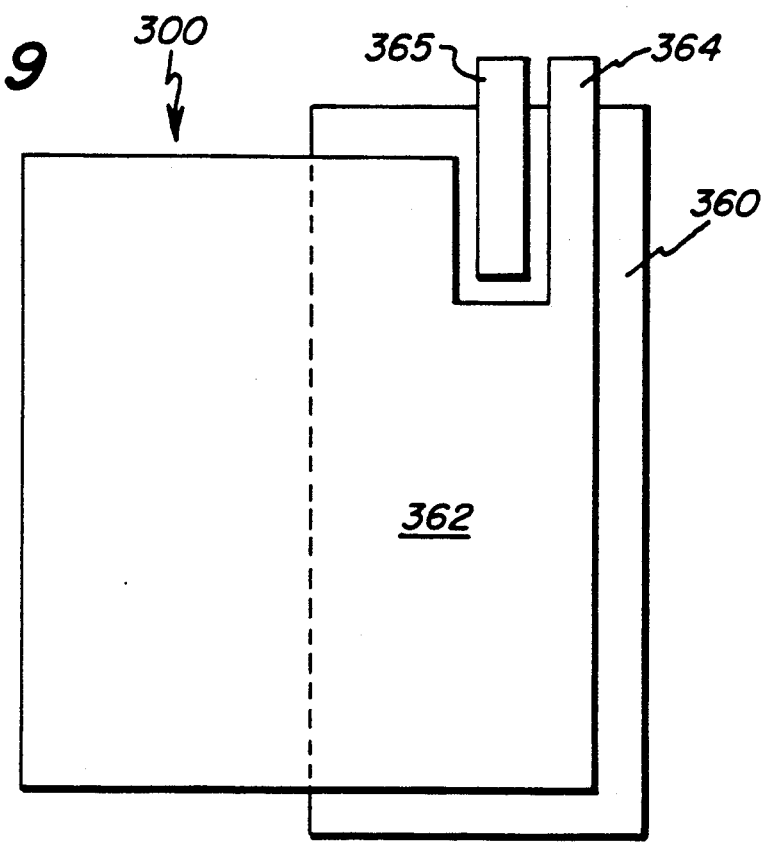
FIG. 9-13 illustrate an alternative configuration for the package of FIG. 4.

An alternative package configuration 359 is illustrated in various stages of fabrication in FIGS. 9-13. In FIG. 9, the package substrate 360 and common or output terminal 362 are illustrated in plan view along with the Kelvin terminals 364 and 365 for one of the switching devices. The Kelvin reference terminal 364 is continuous with the main terminal 362. Both the main terminal 362 and the control terminal 364 are direct bonded to the substrate 360.

Figure 10:
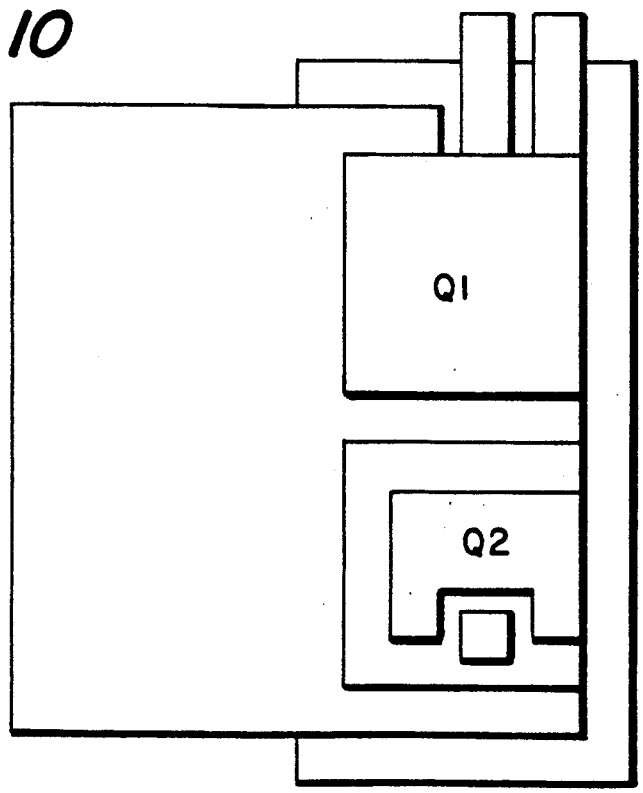

In FIG. 10, the two devices $Q_1$ and $Q_2$ are illustrated mounted on the package 359 of FIG. 9. It will be noted that the upper device $Q_1$ is mounted with its gate and source terminals toward the substrate, while the lower device $Q_2$ is mounted in a drain electrode toward the substrate orientation. The source and gate terminals of both devices are provided with a solderable or solder bump metallization to facilitate direct solder bonding of the source and gate terminals of the upper device $Q_1$ to the output terminal 362 and gate terminal 365.

Figure 11:
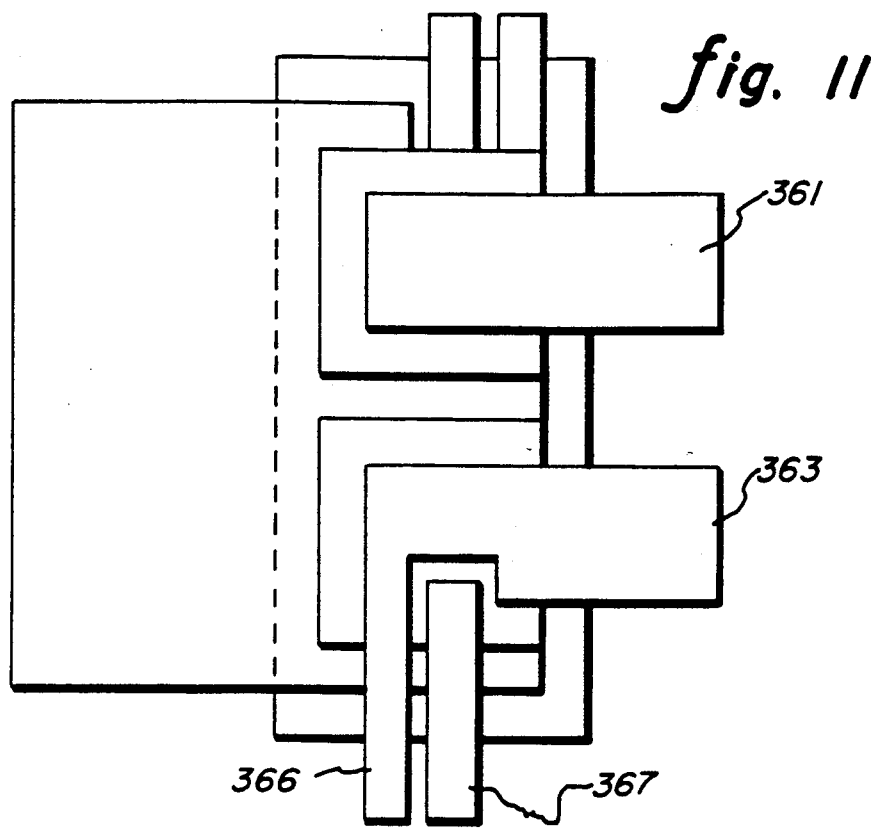

In FIG. 11, the package is illustrated with the external power terminals 361 and 363 of the package bonded respectively to the drain and source of the upper and lower devices. The external gate terminal 367 for the lower device is also shown bonded to the gate terminal of that device. It will be noted that the Kelvin source terminal for the gate circuit is integral with the external power terminal 363. The terminals 361, 363, 366 and 367 are preferably bonded to the devices at the same time as the devices are bonded to the terminals 362, 364 and 365. Where the terminals 361, 363, 366 and 367 are separate from the package substrate, they are preferably held in place by a lead frame until after they have been bonded to the devices and the devices have been encapsulated along with portions of those leads in a dielectric potting compound.

Figure 12:
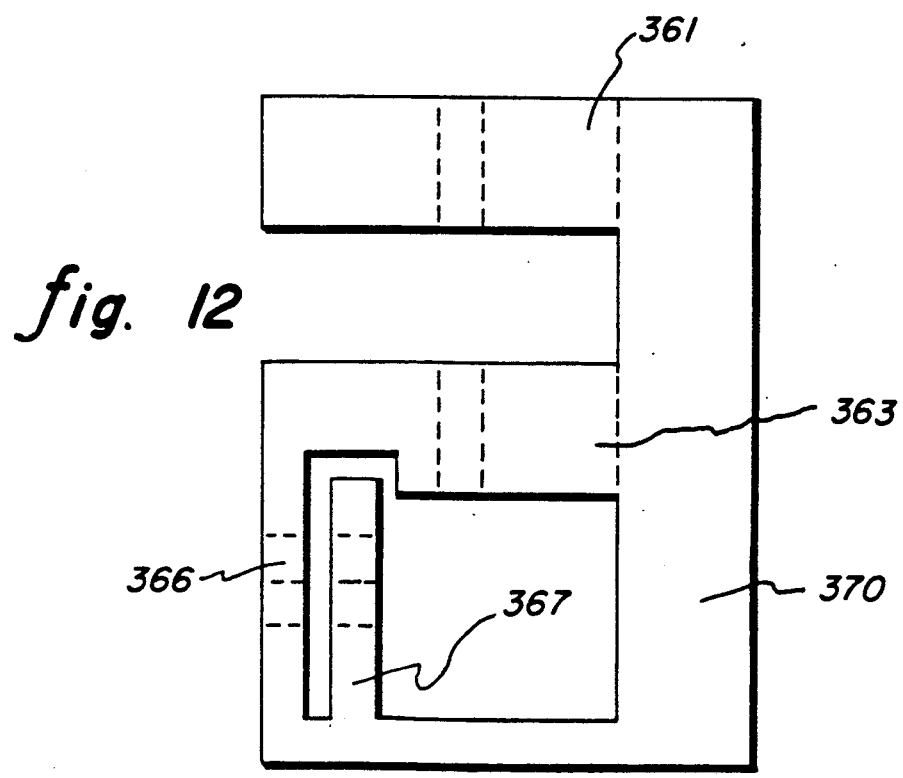
Figure 13:
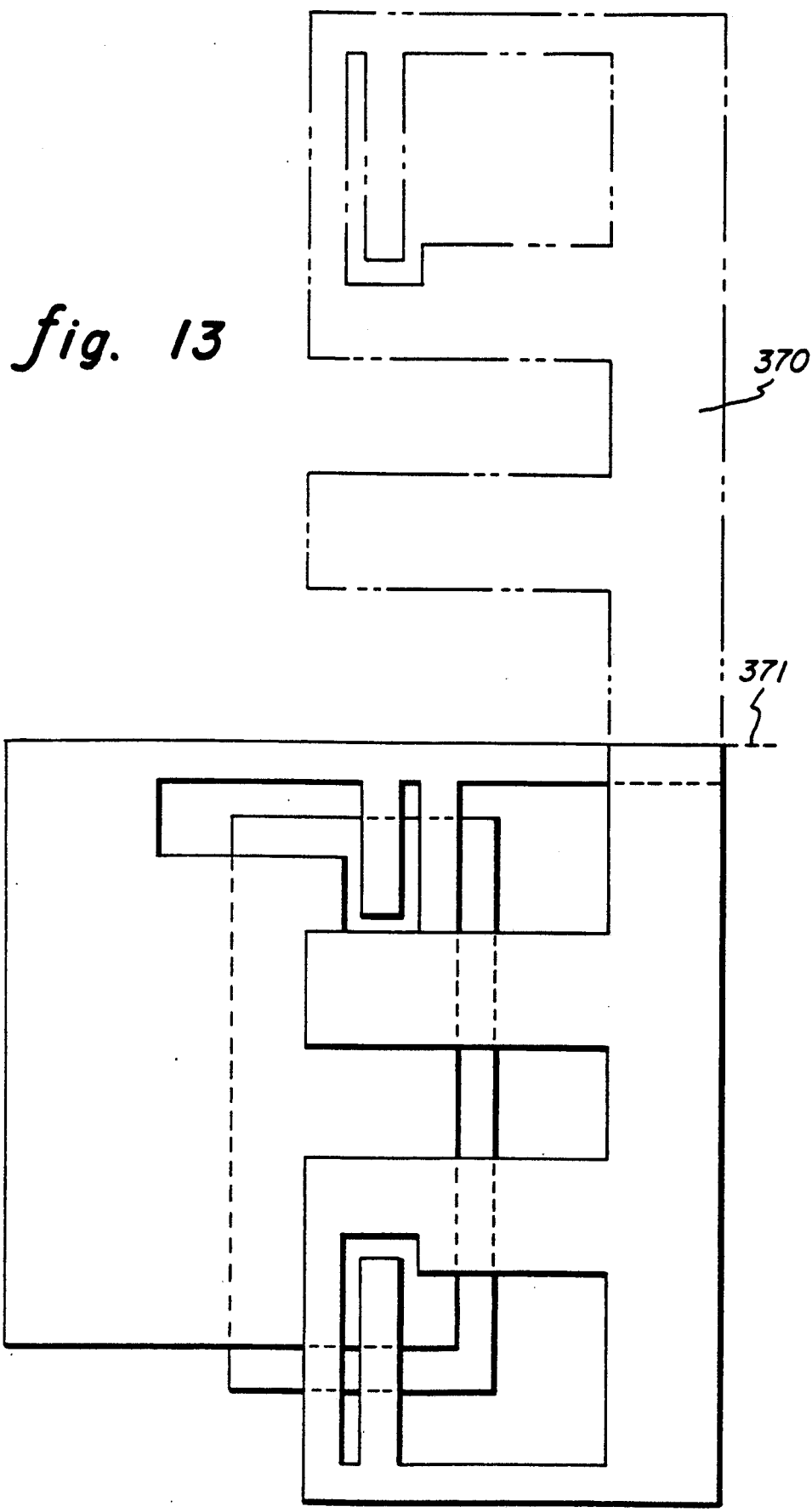

In FIG. 12, the power terminals 361 and 363 and the control terminals 366 and 367 are illustrated in their desired relative position and are held together by a lead frame 370. These terminals, in their lead frame configuration, may be bonded to the devices as discussed above or may be direct bonded to the ceramic substrate 360 for the package prior to mounting of the devices on the package. A package in which these terminals are direct bonded to the ceramic substrate is illustrated in FIG. 13 prior to severing of the lead frame. The terminals 361, 363, 366 and 367 and the terminals 362, 364 and 365 are preferably direct bonded to the ceramic substrate in the same direct bonding operation. It will be observed that because of the overlap of the terminals 361, 363, 366 and 367 over the terminals 362, 364 and 365, two separate lead frames must be used unless the metal of a single lead frame is folded over after formation of the individual leads to bring them into their desired relative orientation. Such a configuration is illustrated in FIG. 13 where the phantom lines indicate the position of the terminals 361, 363, 366 and 367 and their connecting lead frame portion 370 during patterning of the lead frame. After patterning of the lead frame, the lead frame was folded along the line 371 to bring these terminals to their desired relative position with respect to terminals 362, 364 and 365 as is illustrated by their solid line locations in FIG. 13. It will be noted that in order to prevent direct bonding of the terminals 361, 363, 366 and 367 to the terminals 362, 364 and 365, these terminals must be raised above the terminals 362, 364 and 365 during the direct bonding process. Further, space must be provided for insertion of the switching devices $Q_1$ and $Q_2$ under the terminals 361, 363, 366 and 367 on top of the terminals 362, 64 and 365. Consequently, the terminals 361, 363, 366 and 367 are coined during the lead frame fabrication process to raise the device contact portions of these terminals above the terminals 362, 364 and 365 by substantially the thickness of the switching devices. During direct bonding, it is preferred to insert a tungsten or molybdenum plate having the device thickness between the terminals 361, 363, 366 and 367 and the terminals 362, 364 and 365 to ensure that the proper spacing is maintained and no direct bonding of the terminals 361, 363, 366 and 367 to the terminals 362, 364 and 365 occurs. Following the direct bonding of the lead frame to the substrate 360, the lead frame structure is severed from the package to leave the package in the configuration illustrated in FIG. 11 (but without the devices in place yet). It is considered preferable to direct bond the power terminals 361 and 363 to the ceramic substrate 360 rather than merely soldering them to the devices themselves since direct-bonded leads provide an additional heat extraction path for extracting heat from the switching devices and transferring it to the substrate for subsequent transfer to a heat sink. Where that additional heat transfer is not considered necessary, it may be considered preferable to bond the leads to the devices by soldering and to secure those leads in the package by the dielectric potting compound without any direct contact between the power terminals and the package substrate.

The package 359 of FIGS. 9-13 provides a lower inductance than the package 159 of FIG. 4 because of the total absence of wire bond leads. However, it requires that the device source and gate metallizations be solderable which requires additional steps in the device fabrication process. Consequently, a choice between the package 159 and the package 359 will normally be based on trade-offs between the desire for extremely low inductance and the desire for simpler device fabrication processes and package assembly processes.

The switching devices have been described as being soldered to various terminals in various embodiments of packages in accordance with the present invention. Those skilled in the art will recognize that these solder bonds may be replaced by thermocompression and similar bonds by appropriate preparation of the terminals to be bonded.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device package comprising:
   an electrically insulating substrate;
   first, second and third external power terminals each bonded to said substrate;
   a first semiconductor switching device mounted on, and electrically connected to, said first external power terminal; and
   a second semiconductor switching device mounted on, and electrically connected to, said second external power terminal;
   said first and third external power terminals being disposed in opposed relation to said second external power terminal, said first semiconductor switching device further being electrically connected to said second power terminal and said second semiconductor switching device further being electrically connected to said third power terminal, so that said package exhibits minimal inductance.

2. The package recited in claim 1 wherein:
said package is configured to contain said first and second switching devices in a half bridge circuit;
said first and third external power terminals are the supply terminals for said half bridge circuit; and
said second external power terminal is the output terminal for said half bridge circuit.

3. The package recited in claim 2 wherein:
said first, second and third external power terminals each extend beyond an edge of said substrate.

4. The package recited in claim 3, further comprising:
first and second control terminals each bonded to said substrate.

5. The package recited in claim 4 wherein:
said first and second control terminals each extend beyond an edge of said substrate.

6. The package recited in claim 4 wherein:
said first and second control terminals each comprise a pair of Kelvin terminals.

7. The package recited in claim 2 wherein:
said first external power terminal is configured for said first switching device to be bonded directly thereto; and
said second external power terminal is configured for said second switching device to be bonded directly thereto.

8. The package recited in claim 2 wherein:
said second external power terminal is configured for said second power terminal of said first switching device to be bonded direct thereto and for said first power terminal of said second switching device to be bonded direct thereto;
said first external power terminal is configured for said first power terminal of said first switching device to be bonded thereto; and
said third external power terminal is configured for said second power terminal of said second switching device to be bonded thereto, all without the use of wire bonds.

9. The package recited in claim 1 wherein:
said substrate has first through fourth edges, said first and second edges being opposed and said third and fourth edges being opposed;
said first and third external terminals being disposed adjacent said first edge;
said second external terminal being disposed adjacent said second edge; and
said package further comprises first and second external control terminals, each bonded to said substrate and disposed adjacent said third and fourth edges thereof, respectively.

10. A packaged half bridge circuit comprising:
an electrically insulating substrate having first, second and third external power terminals and first and second external control terminals each bonded to said substrate;
said first and third external power terminals being disposed in opposed relation to said second external power terminal;
first and second switching devices;
said first switching device being a semiconductor device having a control terminal and first and second power terminals, said first power terminal of said first device being bonded to said first external power terminal, said second power terminal of said first device being connected to said second external power terminal and said control terminal of said first device being connected to said first external control terminal;
said second switching device being a semiconductor device having a control terminal and first and second power terminals, said first power terminal of said second device being bonded to said second external power terminal, said second power terminal of said second device being connected to said third external power terminal and said control terminal of said second device being connected to said second external control terminal.

11. The packaged half bridge circuit recited in claim 10 wherein:
said first, second and third external power terminals each extend beyond an edge of said substrate.

12. The packaged half bridge rectifier recited in claim 10 wherein:
said first and third external power terminals are the supply terminals for said half bridge circuit; and
said second external power terminal is the output terminal for said half bridge circuit.

13. The packaged half bridge circuit recited in claim 10 wherein:
said second device is rotated 180 degrees with respect to said first device.

14. The packaged half bridge circuit recited in claim 10 wherein:
said substrate has first through fourth edges, said first and second edges being oppose and said third and fourth edges being opposed.

15. The packaged half bridge circuit recited in claim 14 wherein:
said first and third external power terminals are disposed adjacent said first edge of said substrate;
said second external power terminal is disposed adjacent said second edge of said substrate;
said first and second external control terminals are disposed adjacent said third and fourth edges of said substrate, respectively; and
said first external power terminal is disposed between said third external power terminal and said third edge of said substrate.

16. The packaged half bridge circuit recited in claim 15 wherein:
each of said first and second external control terminals comprises a pair of Kelvin terminals.

17. The packaged half bridge circuit recited in claim 10 wherein:
the connection between said second power terminal of said first power device and said second external power terminal comprises either a plurality of wire bonds or a relatively wide, flat strap; and
the connection between said second power terminal of said second power device and said third external power terminal comprises either a plurality of wire bonds or a relatively wide, flat strap.

18. The packaged half bridge circuit recited in claim 10 wherein:
said second power terminal of said first device is bonded to said second external power terminal;
said control terminal of said first device is bonded to said first external control terminal;
said second power terminal of said second device is bonded to said third external power terminal; and said control terminal of said second device is bonded to said second external control terminal.

19. A half bridge circuit for converting dc power to ac power comprising:
- an electrically insulating substrate having first, second and third external power terminals and first and second external control terminals each bonded to said substrate;
- said first and third external power terminals being disposed in opposed relation to said second external power terminal;
- said first and second external control terminals being disposed in opposed relation;
- first and second switching devices;
- said first switching device being a semiconductor device having a control terminal and first and second power terminals, said first power terminal of said first device being bonded to said first external power terminal, said second power terminal of said first device being connected to said second external power terminal and said control terminal of said first device being connected to said first external control terminal;
- said second switching device being a semiconductor device having a control terminal and first and second power terminals, said first power terminal of said second device being bonded to said second external power terminal, said second power terminal of said second device being connected to said third external power terminal and said control terminal of said second device being connected to said second external control terminal;
- a dc voltage connected across said first and third external power terminals of said package; and
- a load connected between said second external power terminal and a reference potential.

20. The packaged half bridge circuit recited in claim 19 wherein:
- said second power terminal of said first device is bonded to said second external power terminal;
- said control terminal of said first device is bonded to said first external control terminal;
- said second power terminal of said second device is bonded to said third external power terminal; and
- said control terminal of said second device is bonded to said second external control terminal.

21. A half bridge circuit for converting, dc power to ac power comprising: an electrically insulating substrate having first, second and third external power terminals and first and second external control terminals each bonded to said substrate;
- said first and third external power terminals being disposed in opposed relation to said second external power terminal;
- said first and second external control terminals being disposed in opposed relation;
- first and second switching devices;
- said first switching device being a semiconductor device having a control terminal and first and second power terminals, said first power terminal of said first device being bonded to said first external power terminal, said second power terminal of said first device being connected to said second external power terminal and said control terminal of said first device being connected to said first external control terminal;
- said second switching device being a semiconductor device having a control terminal and first and second power terminals, said first power terminal of said second device being bonded to said second external power terminal, said second power terminal of said second device being connected to said third external power terminal and said control terminal of said second device being connected to said second external control terminal;
- a dc voltage connected across said first and third external power terminals of said package; and
- a load connected between said second external power terminal and a reference potential.

22. The packaged half bridge circuit recited in claim 21 wherein:
- said circuit further comprises a power transformer having a center-tapped output winding;
- said first and third external power terminals of said package are connected to the ends of said center-tapped output winding; and
- said load is connected between said second external power terminal and the center tap of said output winding.

23. The packaged half bridge circuit recited in claim 21 wherein:
- said second power terminal of said first device is bonded to said second external power terminal;
- said control terminal of said first device is bonded to said first external control terminal;
- said second power terminal of said second device is bonded to said third external power terminal; and
- said control terminal of said second device is bonded to said second external control terminal.

* * * * *